(12) United States Patent
Lee

(10) Patent No.: US 7,820,496 B2
(45) Date of Patent: Oct. 26, 2010

(54) THIN FILM TRANSISTOR SUBSTRATE MANUFACTURED THROUGH 3-SHEET MASK PROCESS, METHOD OF MANUFACTURING THE SAME AND LIQUID CRYSTAL DISPLAY HAVING THE SAME

(75) Inventor: Jong Hyuk Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 857 days.

(21) Appl. No.: 11/610,231

(22) Filed: Dec. 13, 2006

(65) Prior Publication Data

US 2007/0172998 A1 Jul. 26, 2007

(30) Foreign Application Priority Data

Jan. 24, 2006 (KR) .................... 10-2006-0007389

(51) Int. Cl.
*H01L 21/00* (2006.01)
(52) U.S. Cl. ................ 438/149; 438/151; 257/E29.151
(58) Field of Classification Search ................ 438/149, 438/151; 257/E29.151
See application file for complete search history.

(56) References Cited

U.S. PATENT DOCUMENTS

2004/0126917 A1* 7/2004 Yoo et al. ...................... 438/30
2004/0134878 A1* 7/2004 Matsushita et al. ............ 216/23
2004/0183955 A1 9/2004 Souk et al.

OTHER PUBLICATIONS

Chinese Office Action with English Translation for Chinese Patent Application No. 200710003746.8 dated Nov. 13, 2009.

* cited by examiner

*Primary Examiner*—Thanh Nguyen
(74) *Attorney, Agent, or Firm*—Cantor Colburn LLP

(57) ABSTRACT

A thin film transistor substrate and method of manufacturing a thin film transistor substrate through a 3-sheet mask process includes forming a first conductive film on a substrate; forming a gate line including a gate electrode using a first photoresist film pattern formed on the first conductive film through a first mask with a desired pattern formed thereon; sequentially forming a gate insulation film, an active layer, an ohmic contact layer, a second conductive film and a protection film on an entire surface of the substrate; forming an active region and a data line including source-drain electrodes using a second photoresist film pattern that has different thicknesses in predetermined regions and is formed on the protection film through a second mask with a desired pattern formed thereon; forming a contact hole by exposing a channel region of the active layer and partially exposing the source-drain electrodes using the second photoresist pattern; forming a third conductive film on the entire surface of the substrate; and forming a pixel electrode to be connected to the contact hole using a third photoresist film pattern formed on the third conductive film through a third mask with a desired pattern formed thereon. The present invention further provides a liquid crystal display having the same.

16 Claims, 8 Drawing Sheets

THIN FILM TRANSISTOR SUBSTRATE MANUFACTURED THROUGH 3-SHEET MASK PROCESS, METHOD OF MANUFACTURING THE SAME AND LIQUID CRYSTAL DISPLAY HAVING THE SAME

This application claims priority to Korean Patent application No. 10-2006-0007389, filed on Jan. 24, 2006, and all the benefits accruing therefrom under 35 U.S.C. §119, the contents of which are herein incorporated by reference in its entirety.

BACKGROUND OF THE INVENTION

1. Field of the Invention

The present invention relates to a thin film transistor substrate, a method of manufacturing the same and a liquid crystal display having the same. More particularly, the present invention relates to a thin film transistor substrate manufactured through a 3-sheet mask process, a method of manufacturing the same, and a liquid crystal display having the same.

2. Description of the Related Art

A liquid crystal display ("LCD") has advantages of a smaller size, a lighter weight and a larger display screen in contrast to a conventional cathode ray tube ("CRT"). As such, recent development of the LCD has been actively made. LCDs have been used as monitors for laptop and desktop computers, large-sized displays, and displays for mobile communication terminals. The applicable range of their utility is increasingly extending. In such an LCD, light transmittance is controlled by image signals applied to a plurality of control switches arranged in a matrix pattern, thereby displaying a desired image on a panel of the LCD.

To manufacture a thin film transistor substrate for an LCD in the prior art, five or four sheets of masks are generally required. Referring to FIG. 1, a flowchart illustrating a method for manufacturing a thin film transistor substrate through a 5-sheet mask process according to the prior art is shown. Five sheets of masks are required in total in such a manner that a first mask is required in step S10 of forming a gate pattern, a second mask in step S30 of forming an active layer pattern, a third mask in step S40 of forming a source/drain pattern, a fourth mask in step S70 of forming a protection film, and a fifth mask in step S80 of forming pixel electrodes.

In line with a desire to reduce production costs and improve productivity with respect to manufacturing a thin film transistor substrate for an LCD, current research on simplifying the current method of manufacturing a thin film transistor substrate is continuous. Accordingly, a method capable of simplifying manufacture of a thin film transistor substrate using less than 5 or 4 masks without changing the existing production lines is desired.

BRIEF SUMMARY OF THE INVENTION

The present invention is conceived to solve the aforementioned problems in the prior art. An aspect of the present invention is to provide a thin film transistor substrate manufactured through a 3-sheet mask process, a method of manufacturing the same and a liquid crystal display having the same.

According to an exemplary embodiment of the present invention, a method of manufacturing a thin film transistor substrate includes forming a first conductive film on a substrate; forming a gate line including a gate electrode using a first photoresist film pattern formed on the first conductive film through a first mask with a desired pattern formed thereon; sequentially forming a gate insulation film, an active layer, an ohmic contact layer, a second conductive film and a protection film on an entire surface of the substrate; forming an active region and a data line including source-drain electrodes using a second photoresist film pattern that has different thicknesses in predetermined regions and is formed on the protection film through a second mask with a desired pattern formed thereon; forming a contact hole by exposing a channel region of the active layer and partially exposing the source-drain electrodes using the second photoresist pattern; forming a third conductive film on the entire surface of the substrate; and forming a pixel electrode to be connected to the contact hole using a third photoresist film pattern formed on the third conductive film through a third mask with a desired pattern formed thereon.

The second photoresist film pattern may include a first region corresponding to the channel region of the active layer and a second region corresponding to the contact hole.

The thickness of the second photoresist film pattern in the first region may be smaller than that of the second photoresist film pattern in the second region.

The forming the active region and the data line using the second photoresist film pattern formed on the protection film through the second mask may include coating a photoresist film on the protection film; controlling the amount of light exposure in the first region and the second region using the second mask; and forming the second photoresist film pattern by developing the photoresist film.

A slit pattern may be formed in the second mask.

The forming the active region and the data line using the second photoresist film pattern formed on the protection film through the second mask may include forming the active region and the data line by etching the protection film, the second conductive film, the ohmic contact layer and the active layer using the second photoresist film pattern; and decreasing the entire thickness of the second photoresist film pattern through a primary ashing process.

The decreasing the entire thickness of the second photoresist film pattern through the primary ashing process may include performing the primary ashing process until the second photoresist film pattern in the first region is removed.

The forming the contact hole by exposing the channel region of the active layer and partially exposing the source-drain electrodes using the second photoresist pattern may include etching the second conductive film and the protection film formed on the channel region of the active layer; decreasing the entire thickness of the second photoresist film pattern through a secondary ashing process; and forming the contact hole by partially etching the protection film using the second photoresist film pattern.

The decreasing the entire thickness of the second photoresist film pattern through the secondary ashing process may comprise performing the secondary ashing process until the second photoresist film pattern in the second region is removed.

The forming the contact hole by exposing the channel region of the active layer and partially exposing the source-drain electrodes using the second photoresist pattern may further include removing the second photoresist film pattern; and etching the ohmic contact layer formed on the channel region.

The coating the photoresist film on the protection film may include coating the photoresist film with a thickness of about 20,000 Å on the protection film.

The forming the data line may include forming a first portion of the data line including the source-drain electrodes to intersect the gate line and forming a second portion thereof to partially overlap with the gate line and in parallel thereto.

The forming the first and second portions of the data line including the source-drain electrodes may include forming the first and second portions such that one end of the second portion of the data line is spaced apart by a predetermined distance from one end of a second portion of a data line of an adjacent pixel.

The forming the gate line may include forming a gate pad at one end of the gate line, and the forming the data line may include forming a data pad at one end of the data line.

The second photoresist film pattern may further include a third region corresponding to the data pad, and the thickness of the second photoresist film pattern in the second region may be equal to that of the second photoresist film pattern in the third region.

The method may further include forming an alignment film on the entire surface of the substrate.

According to anther exemplary embodiment of the present invention, a thin film transistor substrate includes a gate line formed to extend in one direction on a substrate; a data line formed to intersect the gate line while being insulated therefrom; a thin film transistor formed at the intersection of the gate line and the data line and connected to the gate line and the data line; and a pixel electrode connected to the thin film transistor. At this time, the thin film transistor includes a gate electrode formed on the substrate; a gate insulation film formed on the gate electrode; an active layer formed on the gate insulation film; and an ohmic contact layer, source-drain electrodes and a protection film formed in sequence on an area of the active layer except a channel region of the active layer. According to a further exemplary embodiment of the present invention, a liquid crystal display includes the thin film transistor substrate thus constructed.

BRIEF DESCRIPTION OF THE DRAWINGS

The above and other aspects, features and advantages of the present invention will become apparent from the following description of exemplary embodiments given in conjunction with the accompanying drawings, in which.

DETAILED DESCRIPTION OF THE INVENTION

Figure 1:
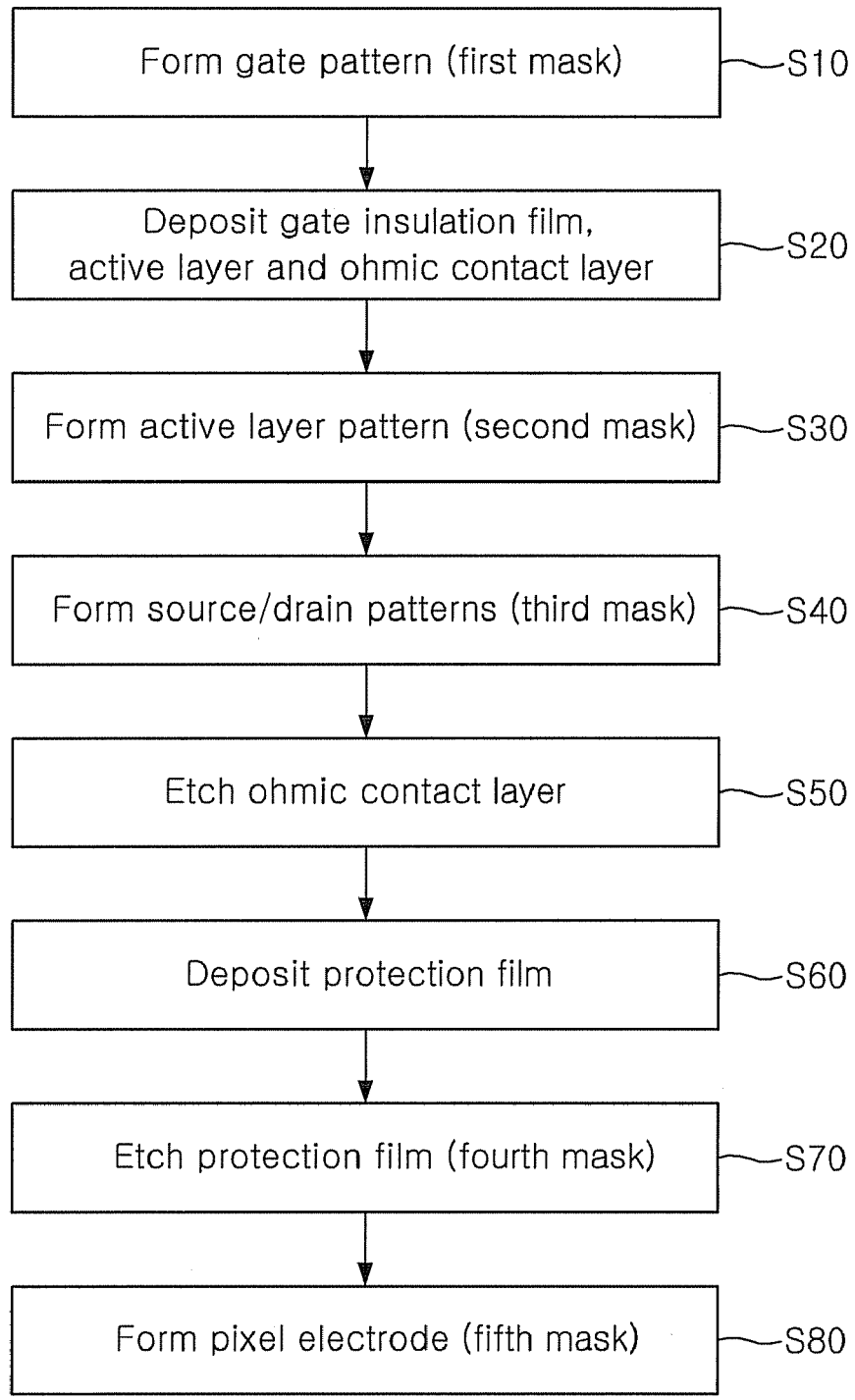
FIG. 1 is a flowchart illustrating a conventional method of manufacturing a thin film transistor substrate.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
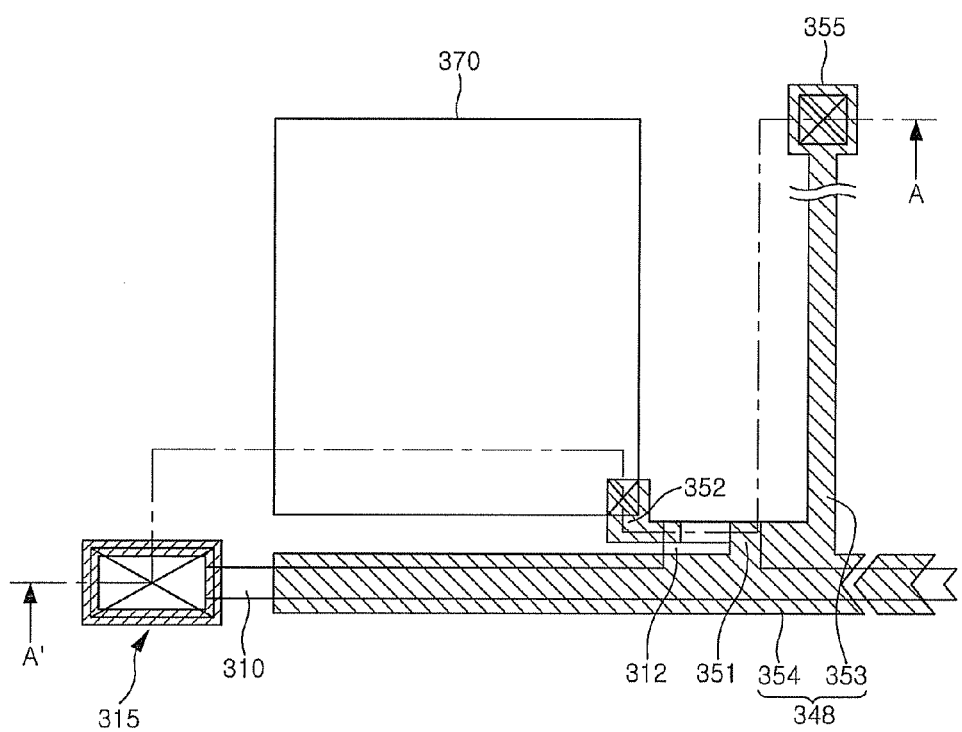
FIG. 2 is a schematic plan view of an exemplary embodiment of a thin film transistor substrate according to the present invention.

FIG. 2 is a schematic plan view of an exemplary embodiment of a thin film transistor substrate according to the present invention. For the sake of convenience of explanation, FIG. 2 illustrates only one unit pixel among a plurality of unit pixels arrayed in a matrix. Referring to FIG. 2, the thin film transistor substrate comprises a gate line 310 formed in one direction of a substrate, a data line 348 insulated from the gate line 310 and intersecting the gate line 310, a unit pixel formed at the intersection of the gate line and the data line, a gate pad 315 formed at one end of the gate line, and a data pad 355 formed at one end of the data line. The unit pixel comprises a thin film transistor, a pixel electrode 370 and a capacitor electrode (not shown). The thin film transistor comprises a gate electrode 312 extending from the gate line 310, a source electrode 351 extending from the data line 348, and a drain electrode 352 connected to the pixel electrode 370. Here, the data line 348 may include a first data line 353 formed to intersect the gate line 310, and a second data line 354 formed to intersect the first data line 353, i.e., in a direction parallel to the gate line 310. The second data line 354 is formed to be spaced apart by a certain distance, preferably about 5 μm to about 6 μm, from another second data line 354 of an adjacent unit pixel.

FIGS. 3A to 3K are schematic cross-sectional views illustrating an exemplary embodiment of a method of manufacturing the thin film transistor substrate according to the present invention. FIGS. 3A to 3K are cross-sectional views taken along line A-A' in FIG. 2.

Figure 3A:
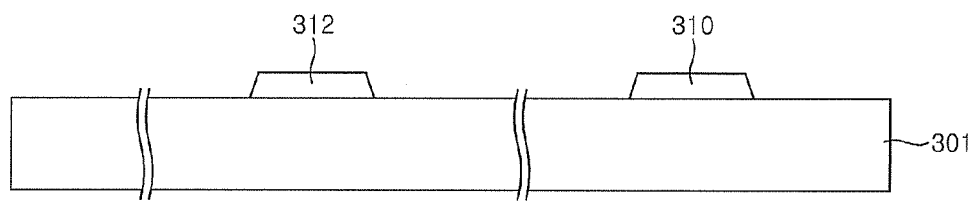
FIGS. 3A to 3K are schematic cross-sectional views illustrating an exemplary embodiment of a method of manufacturing the thin film transistor substrate according to the present invention.

Referring to FIG. 3A, a first conductive film (not shown) is formed on a transparent insulative substrate 301 that in turn is subjected to a photolithography process using a first photoresist pattern (not shown) to form a gate line 310 and a gate electrode 312.

The first conductive film is formed on the transparent insulative substrate 301 by means of a deposition method such as a chemical vapor deposition ("CVD") method, a physical vapor deposition ("PVD") method, a sputtering process, or the like. Preferably, the first conductive film is made of at least one of Cr, MoW, Cr/Al, Cu, Al(Nd), Mo/Al, Mo/Al(Nd) and Cr/Al(Nd), and may be formed as a multi-layered film.

Then, a photoresist film is coated and a photolithography process using a first mask (not shown) is then performed to form a first photoresist film pattern. An etching process is performed using the first photoresist film pattern as an etching mask, thereby forming the gate line 310 and the gate electrode 312, as shown in FIG. 3A.

Thereafter, a stripping process is carried out to remove the remainder of the first photoresist film pattern existing on the gate line 310 and the gate electrode 312.

Figure 3B:
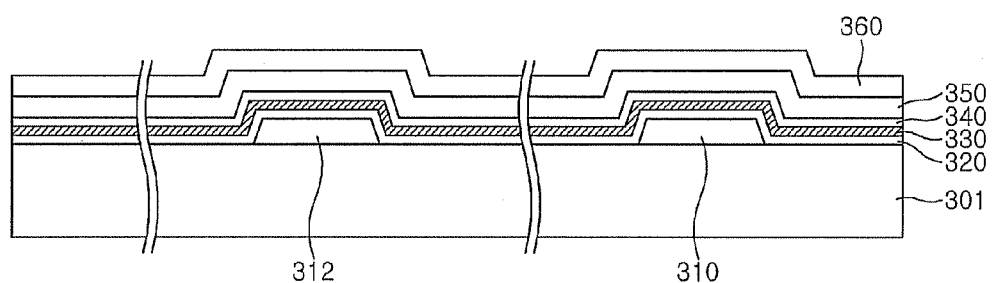

Referring to FIG. 3B, a gate insulation film 320, an active layer 330, an ohmic contact layer 340, a second conductive film 350 and a protection film 360 are formed in sequence on the entire surface of the substrate 301 where the gate line 310 and the gate electrode 312 have been formed.

The gate insulation film 320 is formed on the entire surface of the substrate 301 through a deposition process such as a plasma enhanced chemical vapor deposition ("PECVD") method, a sputtering process or the like. Here, the gate insulation film 320 is preferably made of an inorganic insulative material such as silicone oxide or silicone nitride. Then, the active layer 330, the ohmic contact layer 340, the second conductive film 350 and the protection film 360 are formed in sequence on the gate insulation film 320 using the aforementioned deposition method. Here, the active layer 330 is formed of an amorphous silicone layer, and the ohmic contact layer 340 is formed of a silicide layer, or an amorphous silicone layer doped with a high concentration of N-type impurities. In addition, the second conductive film 350 is formed as a single-layered film or a multi-layered film made of at least one of Mo, Al, Cr, and Ti. It will be also apparent to those skilled in the art that the second conductive film may be made of the same material as the first conductive film. It is preferred that the protection film 360 be made of the same insulative material as the gate insulation film 320. The protection film 360 may be formed as a multi-layered film, including a film including an inorganic protection layer and an organic protection layer, for example.

Figure 3C:
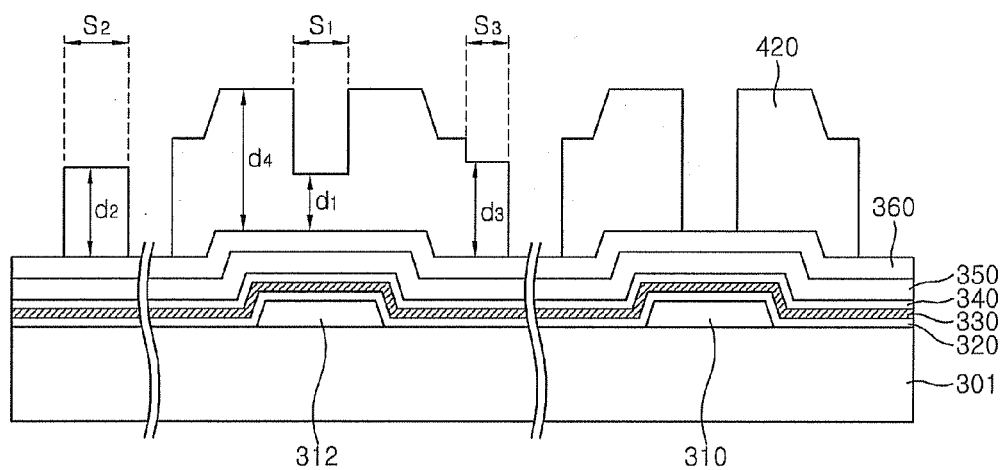

Referring to FIG. 3C, a photoresist film (not shown) is coated on the entire surface of the substrate and a second photoresist film pattern 420 is then formed through a photolithography process using a second mask (not shown). Here, the photoresist film forming the second photoresist film pattern is coated with a thickness of more than 20,000 Å.

The second photoresist film pattern 420 is formed to have different thicknesses in different regions. The second photoresist film pattern 420 includes a region $S_1$ corresponding to a channel region of a thin film transistor, a region $S_2$ corresponding to a data pad region formed at one end of a data line 348, and a region $S_3$ corresponding to a contact hole to which a drain electrode 352 and a pixel electrode 370 of a thin film transistor are connected. Here, $d_1$ is a thickness of the region $S_1$, $d_2$ is a thickness of the region $S_2$, $d_3$ is a thickness of the region $S_3$, and $d_4$ is a thickness of the photoresist film before the second photoresist film pattern 420 is formed. The thickness $d_1$ is the smallest, and the thicknesses $d_2$ and $d_3$ are larger than the thickness $d_1$ and smaller than the thickness $d_4$. In addition, it is preferred that the thickness $d_2$ be equal to the thickness $d_3$.

As described above, in order to form the second photoresist film pattern 420 with different thicknesses in certain areas, slit patterns are formed in predetermined areas of the second mask, i.e., areas corresponding to the regions $S_1$, $S_2$ and $S_3$ thereof. Due to the slit patterns formed on the second mask, the $S_1$, $S_2$ and $S_3$ regions on the second photoresist pattern 420 are insufficiently exposed to light and thus have different thicknesses after development. The process of forming the second photoresist film pattern 420 will be explained later with reference to FIG. 4.

Figure 3D:
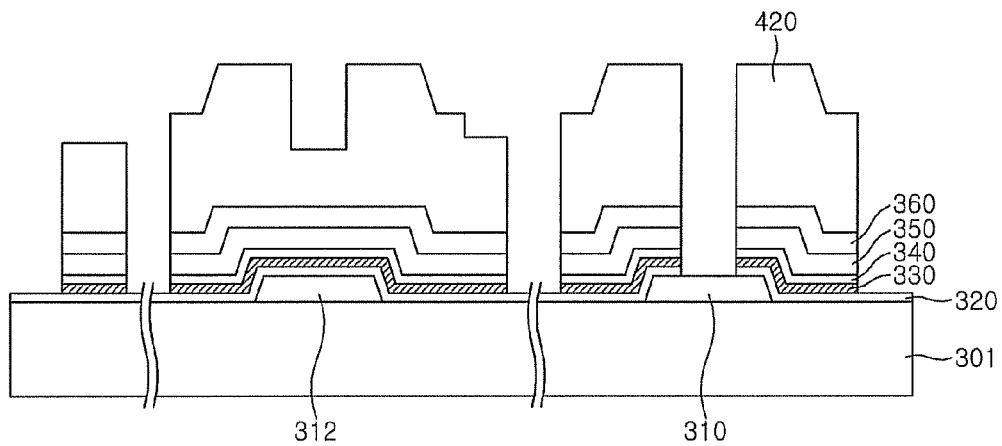

Referring to FIG. 3D, an etching process is performed using the second photoresist film pattern 420 as an etching mask and using the gate insulation film 320 as an etching stop film, thereby forming an active region on the gate electrode 312. In addition, a gate pad region is formed at one end of the gate line 310, and a data pad region is formed at one end of the data line 348. At this time, the gate insulation film 320 of the gate pad region is etched to partially expose the gate line 310.

Figure 3E:
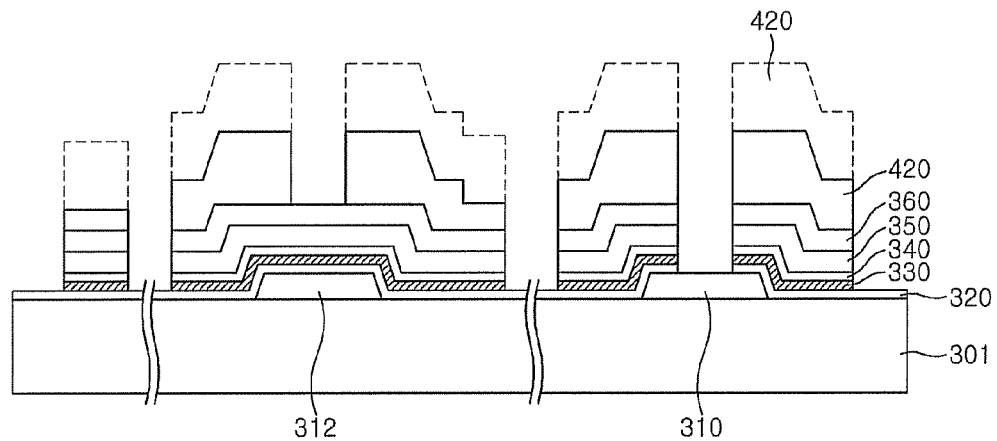

Referring to FIG. 3E, a primary ashing process is performed to reduce the entire thickness of the second photoresist film pattern 420 (shown with dashed lines). Here, the primary ashing process may be carried out using oxygen plasma. The primary ashing process is continued until the channel region of the thin film transistor is exposed. That is, the primary ashing process is continued until the second photoresist film pattern 420 in the region $S_1$ is removed.

Figure 3F:
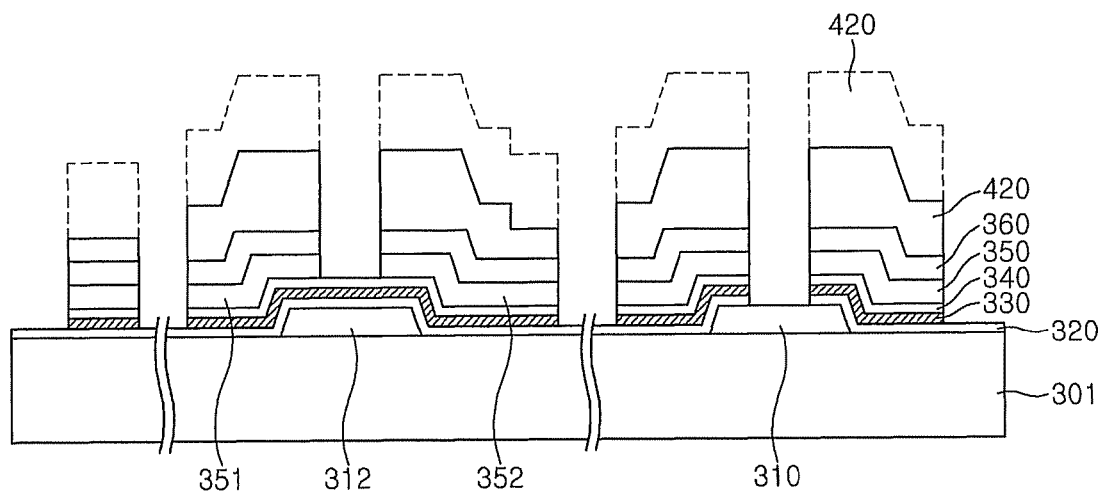

Referring to FIG. 3F, by using the second photoresist film pattern 420 as an etching mask from which the region $S_1$ has been removed through the primary ashing process, an etching process is carried out to etch the protection film 360 and the second conductive film 350, thereby forming a source electrode 351 and the drain electrode 352.

Figure 3G:
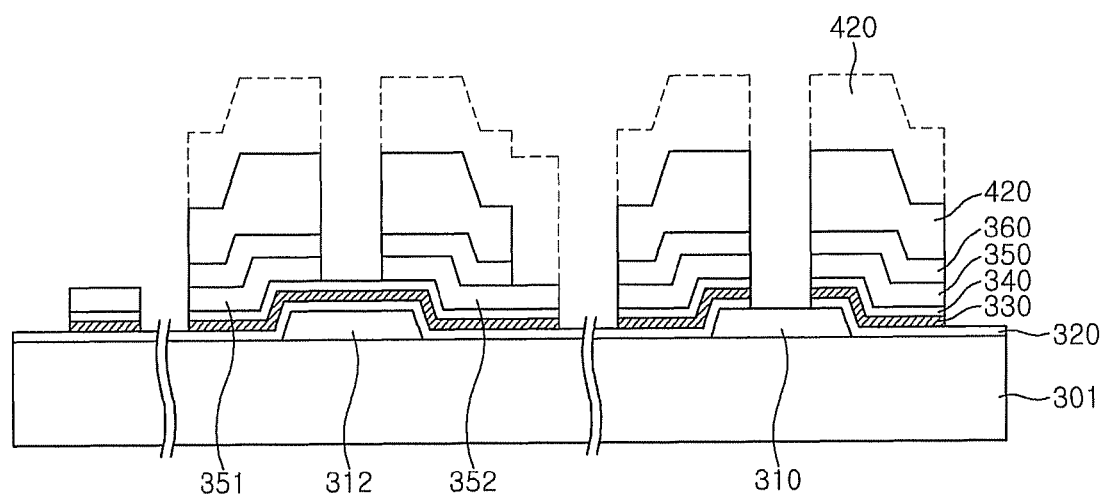

Referring to FIG. 3G, a secondary ashing process is performed to reduce the entire thickness of the second photoresist film pattern 420. At this time, the secondary ashing process may also be carried out using oxygen plasma. The secondary ashing process is continued until the region $S_3$ corresponding to a contact hole region for connecting the drain electrode 352 to the pixel electrode 370 to be described later, and a portion of the second photoresist film pattern 420 in the region $S_2$ corresponding to the data pad region are removed. Thereafter, by using the second photoresist film pattern 420 as an etching mask from which the regions $S_2$ and $S_3$ have been removed through the secondary ashing process, an etching process is performed to remove the protection film 360.

Figure 3H:
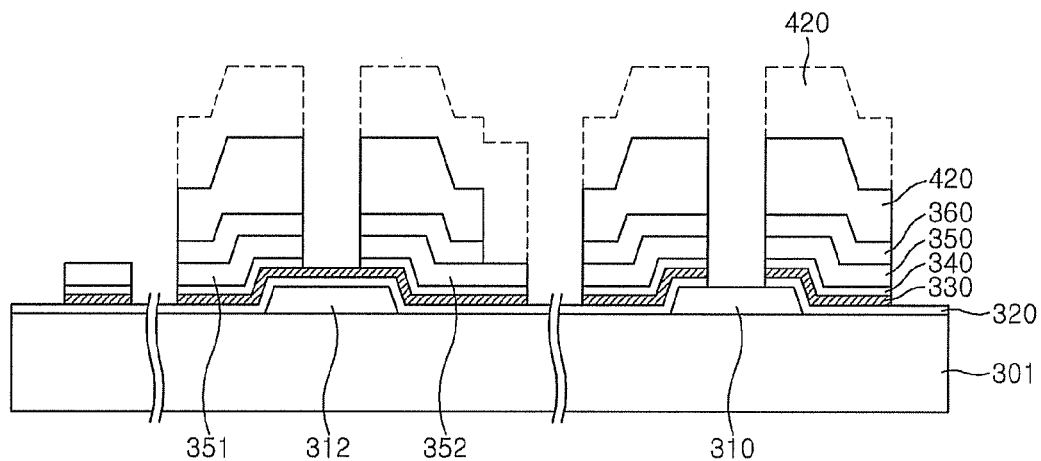

Referring to FIG. 3H, by using the second photoresist film pattern 420 as an etching mask, the channel region of the thin film transistor is etched to form an ohmic contact layer 340 connecting the source electrode 351 and the drain electrode 352.

Figure 3I:
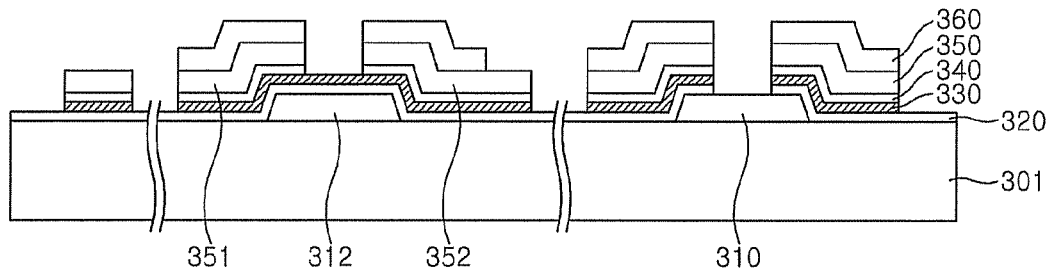

Referring to FIG. 3I, a stripping process is performed to remove the remainder of the second photoresist film pattern 420 existing on the entire surface of the substrate 301.

Figure 3J:
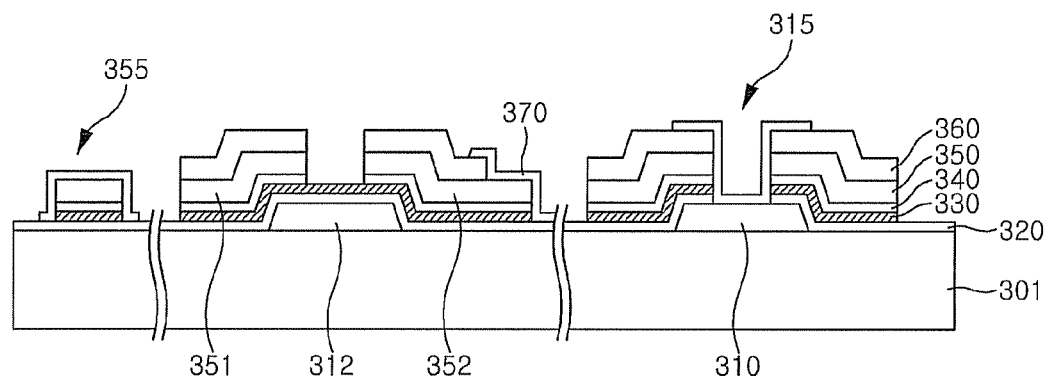

Referring to FIG. 3J, a third conductive film (not shown) is formed on the entire surface of the substrate 301 and a third photoresist film pattern (not shown) is then formed through a photolithography process using a third mask (not shown). An opening area of the third conductive film is removed through an etching process using the third photoresist film pattern as an etching mask and the third photoresist film pattern is removed through a predetermined stripping process, thereby forming the pixel electrode 370, a gate pad 315 and a data pad 355. At this time, it is preferred that the third conductive film be formed of a transparent conductive film containing indium tin oxide (ITO) or indium zinc oxide (IZO).

Figure 3K:
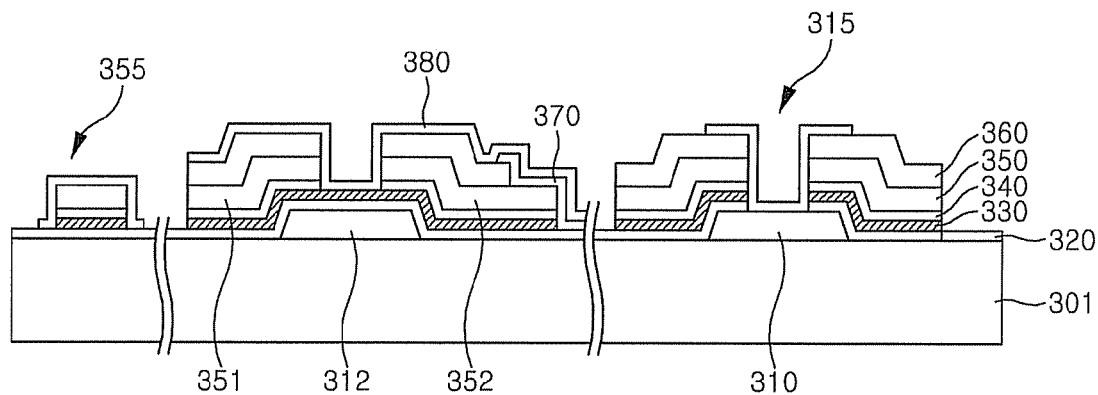

Referring to FIG. 3K, an alignment film 380 is formed on the entire surface of the thin film transistor substrate with the thin film transistor formed thereon. In the thin film transistor of the thin film transistor substrate manufactured through the aforementioned 3-sheet mask process, the active layer 330 of the channel region is exposed. Thus, it is desirable to form the alignment film 380 after the pixel electrode 370 is formed.

Figure 4A:
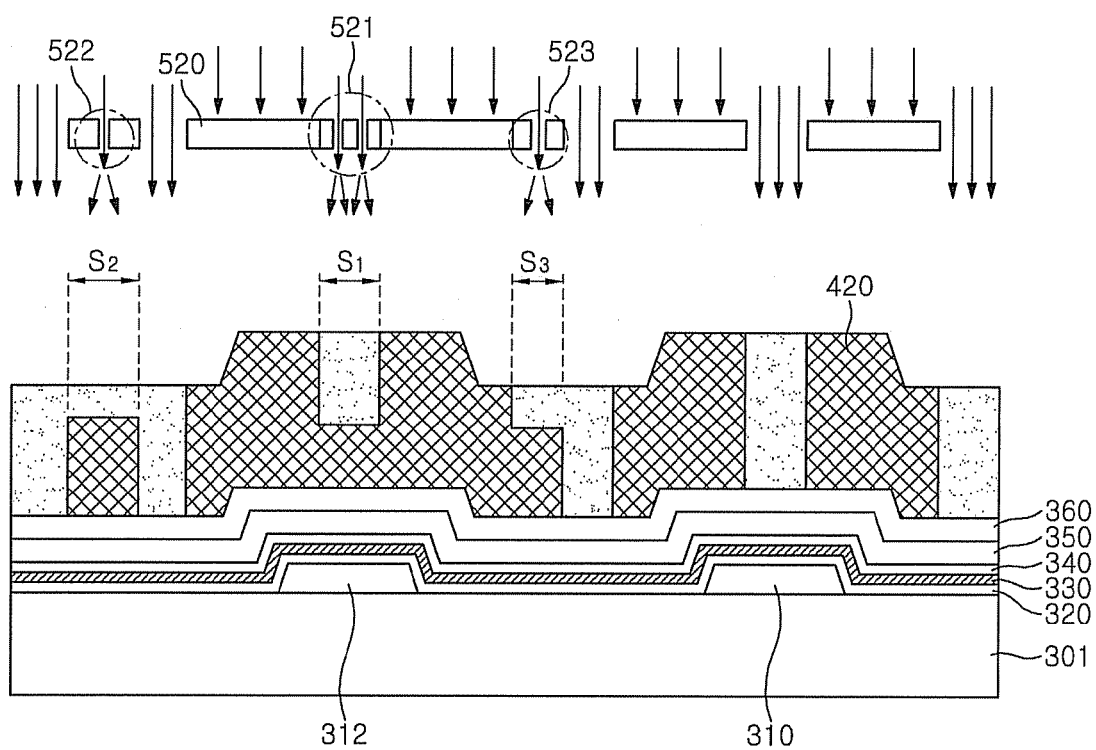
FIGS. 4A and 4B are cross-sectional views illustrating a process of fabricating a photoresist film pattern according to the present invention.
Figure 4B:
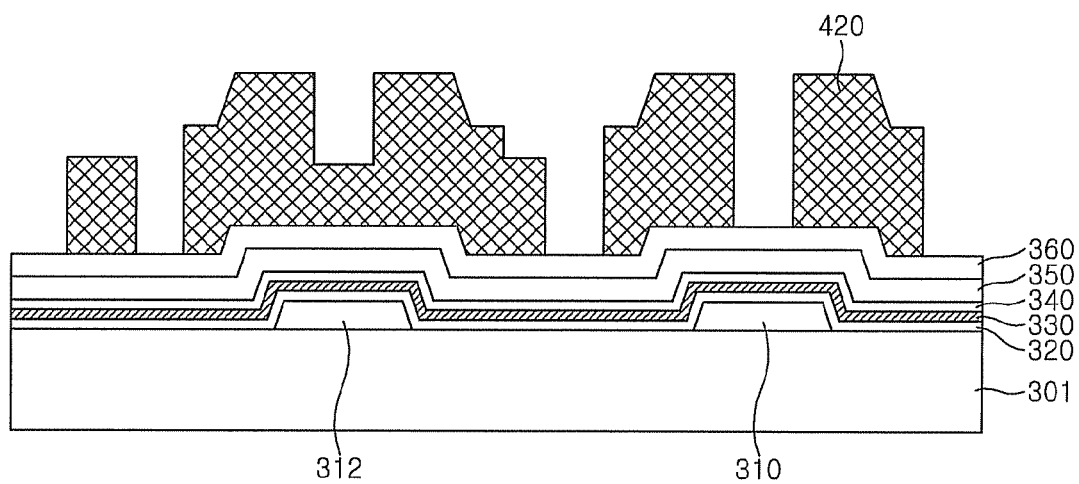

FIGS. 4A and 4B are cross-sectional views illustrating a process of fabricating an exemplary photoresist film pattern according to the present invention. FIGS. 4a and 4b illustrate the process of forming the second photoresist film pattern 420 using a second mask 520 in the exemplary method of manufacturing the thin film transistor substrate explained with reference to FIGS. 3A to 3K.

First, the gate insulation film 320, the active layer 330, the ohmic contact layer 340, the second conductive film 350 and the protection film 360 are formed in sequence on the entire surface of the substrate where the gate line 310 and the gate electrode 312 have been formed. Thereafter, the photoresist film is coated with a thickness, preferably, about 20,000 Å or more on the entire surface of the substrate.

In order to form the second photoresist film pattern 420 such that it has the regions $S_1$, $S_2$ and $S_3$ with different thicknesses, slit patterns 521, 522 and 523 are formed in regions on the second mask 520, i.e., areas corresponding to the regions $S_1$, $S_2$ and $S_3$, respectively. Here, as explained above, the thickness of the region $S_1$ is smaller than those of the regions $S_2$ and $S_3$, and the thickness of the region $S_2$ is equal to that of the region $S_3$. To this end, the slit pattern 521 is configured to transmit more light therethrough than the slit patterns 522 and 523. For example, the number of slits of the slit patterns 521 is made to be larger than that of the slit patterns 522 and 523.

When light is transmitted through the second mask 520 with the slit patterns 521, 522 and 523 formed therein as above, the light that has been transmitted through the slit patterns 521, 522 and 523 is diffracted so that regions on the photoresist film corresponding to the slit patterns 521, 522 and 523 are subjected to under-exposure as compared with open regions. After the light exposing, a developing process is performed to form the second photoresist film pattern 420, as illustrated in FIG. 4B.

Although the above exemplary embodiment of the present invention has been described in connection with an example in which slit patterns are formed in a mask in order to control light transmittance, it is not limited thereto. For example, a translucent mask with a translucent portion may be used to control light transmittance.

Figure 5:
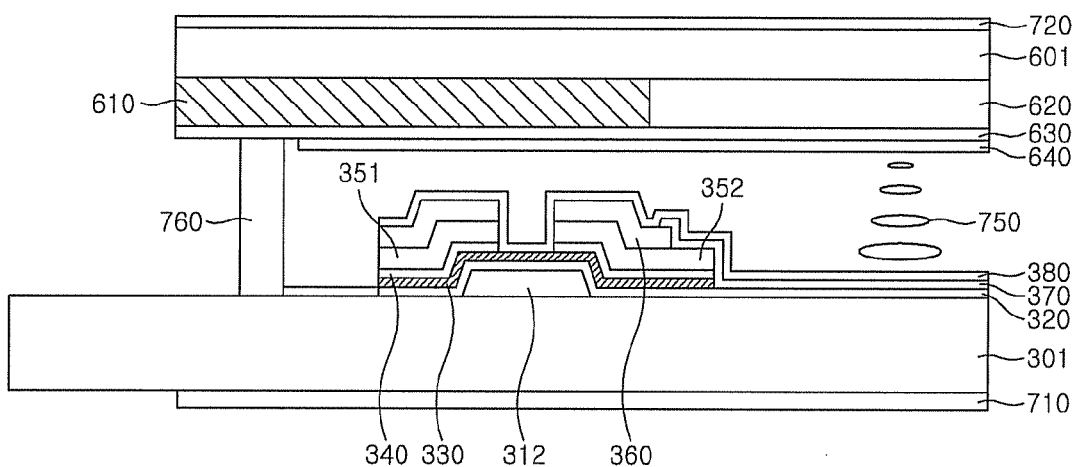
FIG. 5 is a schematic cross-sectional view of a liquid crystal display including the exemplary embodiment of the thin film transistor substrate according to the present invention.

FIG. 5 is a schematic cross-sectional view of a liquid crystal display including the above described exemplary embodiment of the thin film transistor substrate according to the present invention.

Referring to FIG. 5, the liquid crystal display comprises a thin film transistor substrate, a color filter substrate formed to face the thin film transistor substrate, and a liquid crystal layer 750 injected between the thin film transistor substrate and the color filter substrate.

The thin film transistor substrate comprises a thin film transistor that is a switching element formed at the intersection of a gate line (not shown) and a data line (not shown); a pixel electrode 370 made of transparent conductive ITO for applying a signal voltage, which is applied to the thin film transistor, to a liquid crystal cell; and a storage capacitor (not shown) for holding the signal voltage applied to the pixel electrode for a certain period of time. The thin film transistor comprises a gate electrode 312 formed on a substrate 301; a gate insulation film 320 formed on the gate electrode 312; an active layer 330 formed on the gate insulation film 320; and an ohmic contact layer 340, source-drain electrodes 351 and 352 and a protection film 360 formed in sequence on an area of the active layer 330 except a channel region of the active layer 330. At this time, the thin film transistor substrate is manufactured through a 3-sheet mask process, as explained above.

Meanwhile, the color filter substrate is fabricated by sequentially forming a black matrix 610, a color filter 620, a common electrode 630 and an alignment film 640 on a substrate 601. At this time, an overcoat film (not shown) may be formed between the common electrode 630 and the color filter 620.

A spacer (not shown) is interposed between the color filter substrate and the thin film transistor substrate. A liquid crystal layer 750 is injected into a space provided by the spacer. A seal pattern 760 is formed at a periphery of the substrate to bond the color filter substrate and the thin film transistor substrate to each other.

As described above, according to the present invention, a thin film transistor substrate can be manufactured through a 3-sheet mask process, without changing the existing production line. Thus, the manufacturing process can be simplified, resulting in a reduction of production costs.

The foregoing is merely illustrative exemplary embodiments of a thin film transistor substrate, a method of manufacturing the same, and an LCD having the same according to the present invention. The present invention is not limited to the exemplary embodiments. It will be readily understood by those skilled in the art that various modifications and changes can be made thereto without departing from the spirit and scope of the present invention defined by the appended claims.

What is claimed is:

1. A method of manufacturing a thin film transistor substrate, the method comprising:
    forming a first conductive film on a substrate;
    forming a gate line including a gate electrode using a first photoresist film pattern formed on the first conductive film through a first mask with a desired pattern formed thereon;
    sequentially forming a gate insulation film, an active layer, an ohmic contact layer, a second conductive film and a protection film on an entire surface of the substrate;
    forming an active region and a data line including source-drain electrodes using a second photoresist film pattern formed on the protection film through a second mask with a desired pattern formed thereon, the second photoresist pattern having different thicknesses in predetermined regions;
    forming a contact hole by exposing a channel region of the active layer and partially exposing the source-drain electrodes using the second photoresist pattern;
    forming a third conductive film on the entire surface of the substrate; and
    forming a pixel electrode to be connected to the contact hole using a third photoresist film pattern formed on the third conductive film through a third mask with a desired pattern formed thereon,
    wherein the protection film is made of insulative material.

2. The method as claimed in claim 1, wherein the second photoresist film pattern includes a first region corresponding to the channel region of the active layer and a second region corresponding to the contact hole.

3. The method as claimed in claim 2, wherein a thickness of the second photoresist film pattern in the first region is smaller than that of the second photoresist film pattern in the second region.

4. The method as claimed in claim 3, wherein the forming the active region and the data line using the second photoresist film pattern formed on the protection film through the second mask comprises:
    coating a photoresist film on the protection film;
    controlling the amount of light exposure in the first region and the second region using the second mask; and
    forming the second photoresist film pattern by developing the photoresist film.

5. The method as claimed in claim 4, wherein a slit pattern is formed in the second mask.

6. The method as claimed in claim 4, wherein the forming the active region and the data line using the second photoresist film pattern formed on the protection film through the second mask comprises:
    forming the active region and the data line by etching the protection film, the second conductive film, the ohmic contact layer and the active layer using the second photoresist film pattern; and
    decreasing an entire thickness of the second photoresist film pattern through a primary ashing process.

7. The method as claimed in claim 6, wherein the decreasing the entire thickness of the second photoresist film pattern through the primary ashing process comprises:
    performing the primary ashing process until the second photoresist film pattern in the first region is removed.

8. The method as claimed in claim 6, wherein the forming the contact hole by exposing the channel region of the active layer and partially exposing the source-drain electrodes using the second photoresist pattern comprises:
    etching the second conductive film and the protection film formed on the channel region of the active layer;
    decreasing the entire thickness of the second photoresist film pattern through a secondary ashing process; and
    forming the contact hole by partially etching the protection film using the second photoresist film pattern.

9. The method as claimed in claim 8, wherein the decreasing the entire thickness of the second photoresist film pattern through the secondary ashing process comprises:
    performing the secondary ashing process until the second photoresist film pattern in the second region is removed.

10. The method as claimed in claim 8, wherein the forming the contact hole by exposing the channel region of the active layer and partially exposing the source-drain electrodes using the second photoresist pattern further comprises:
    removing the second photoresist film pattern; and
    etching the ohmic contact layer formed on the channel region.

11. The method as claimed in claim 4, wherein the coating the photoresist film on the protection film comprises:
    coating the photoresist film with a thickness of about 20,000 Å on the protection film.

12. The method as claimed in claim 3, wherein the forming the data line comprises:
    forming a first portion of the data line including the source-drain electrodes to intersect the gate line and forming a second portion thereof to partially overlap the gate line and in parallel thereto.

13. The method as claimed in claim 12, wherein the forming the first and second portions of the data line including the source-drain electrodes comprises:
    forming the first and second portions such that one end of the second portion of the data line is spaced apart by a predetermined distance from one end of a second portion of another data line of an adjacent pixel.

14. The method as claimed in claim 8, wherein the forming the gate line comprises forming a gate pad at one end of the gate line, and
    forming the data line comprises forming a data pad at one end of the data line.

15. The method as claimed in claim 14, wherein the second photoresist film pattern further includes a third region corresponding to the data pad, and a thickness of the second photoresist film pattern in the second region is equal to that of the second photoresist film pattern in the third region.

16. The method as claimed in claim 3, further comprising forming an alignment film on the entire surface of the substrate.

* * * * *